(12) United States Patent
Rappo et al.

(10) Patent No.: US 8,339,904 B2
(45) Date of Patent: Dec. 25, 2012

(54) REINFORCED MICRO-MECHANICAL PART

(75) Inventors: René Rappo, Bellmund (CH); Marc Lippuner, Grenchen (CH); Lionel Paratte, Neuchâtel (CH); Thierry Conus, Lengnau (CH)

(73) Assignee: ETA SA Manufacture Horlogère Suisse, Grenchen (CH)

( * ) Notice: Subject to any disclaimer, the term of this patent is extended or adjusted under 35 U.S.C. 154(b) by 315 days.

(21) Appl. No.: 11/994,234

(22) PCT Filed: Jun. 21, 2006

(86) PCT No.: PCT/EP2006/005959
§ 371 (c)(1),
(2), (4) Date: Jul. 22, 2009

(87) PCT Pub. No.: WO2007/000271
PCT Pub. Date: Jan. 4, 2007

(65) Prior Publication Data
US 2010/0214880 A1 Aug. 26, 2010

(30) Foreign Application Priority Data
Jun. 28, 2005 (EP) .................................... 05013912

(51) Int. Cl.
G04B 15/00 (2006.01)

(52) U.S. Cl. .................... 368/327; 368/140; 368/127

(58) Field of Classification Search ............... 368/127, 368/140, 327
See application file for complete search history.

(56) References Cited

U.S. PATENT DOCUMENTS

| 4,196,233 | A | 4/1980 | Bitzer et al. |
| 5,152,851 | A * | 10/1992 | Yamamoto et al. ............ 148/333 |
| 5,242,711 | A * | 9/1993 | DeNatale et al. ........... 427/249.9 |
| 5,424,224 | A | 6/1995 | Allen et al. |
| 6,203,904 | B1 * | 3/2001 | Sacks ............................. 428/368 |
| 6,755,566 | B2 | 6/2004 | Damasko |
| 7,077,562 | B2 * | 7/2006 | Bourgeois et al. ............ 368/175 |
| 2002/0167865 | A1 * | 11/2002 | Tokoro et al. ................. 368/175 |
| 2005/0281137 | A1 | 12/2005 | Bourgeois et al. |
| 2006/0055097 | A1 | 3/2006 | Conus et al. |

FOREIGN PATENT DOCUMENTS

| DE | 198 08 326 | | 5/1999 |
| EP | 0 732 635 | A1 | 9/1996 |
| EP | 1 422 436 | A1 | 5/2004 |
| FR | 2 855 651 | | 12/2002 |
| WO | 2004/070476 | A2 | 8/2004 |
| WO | 2004/092049 | | 10/2004 |

OTHER PUBLICATIONS

Partial Translation of Haenni—Source gb.espacenet.com; Sep. 14, 2010.*
Translation of EP 0732635 :: Source espacenet.com; Feb. 16, 2011.*

(Continued)

Primary Examiner — Sean Kayes
(74) Attorney, Agent, or Firm — Griffin & Szipl, P.C.

(57) ABSTRACT

The micro-mechanical part, for example a horological movement part, includes a silicon core (1) all or part of the surface (3) of which is coated with a thick amorphous material (2). This material is preferably silicon dioxide and has a thickness which is five times greater than the thickness of native silicon dioxide.

10 Claims, 2 Drawing Sheets

OTHER PUBLICATIONS

Semiconductors devices: physics and technology—Oxidation and Film Deposition (ed. John Wiley & Sons, ISBN 0-471-87424-8, 01.01 1985, p. 341-355).

International Search Report issued in corresponding application No. PCT/EP2006/005959, completed Sep. 25, 2006 and mailed Oct. 19, 2006.

Yasutake, K. et al., "Crack healing and fracture strength of silicon crystals," Journal of Materials Science 21, 1986, pp. 2185-2192.

Bhushan, B., "Tribology on the macroscale to nanoscale of microelectromechanical system materials: a review," Proc Instn Mech Engrs., vol. 215, Part J, 2001, pp. 1-18.

Ericson, Frederic and Jan-Ake Schweitz, "Micromechanical fracture strength of silicon," J.Appl. Phys. 66(11) Dec. 1, 1990, pp. 5840-5844, (previously submitted).

Landis, Product-by-process claims, Landis on Mechanics of Patent Claim Drafting, 2008, pp. 10-33-10-37 (previously submitted).

Petersen, Kurt E., "Silicon as a Mechanical Material," Proceedings of the IEEE, vol. 70, No. 5, May 1982, pp. 420-457.

* cited by examiner

REINFORCED MICRO-MECHANICAL PART

This is a National Phase Application in the United States of International Patent Application PCT/EP 2006/005959 filed Jun. 21, 2006, which claims priority on European Patent Application No. 05013912.0, filed Jun. 28, 2005. The entire disclosures of the above patent applications are hereby incorporated by reference.

TECHNICAL FIELD

The present invention concerns a micro-mechanical part made of silicon, said part having been treated in order to give improved mechanical properties. It is for example, but in a non limitative manner, a micro-mechanical part for a horological mechanical movement, i.e. either a part having an active function for example for transmitting and/or transforming an energy to drive hands in order to give a time indication in connection with a dial, or a passive part for example for positioning wheel sets.

BACKGROUND OF THE INVENTION

Silicon is a material which is used more and more often in the manufacture of mechanical parts and in particular of micro-mechanical parts, both "captive" parts i.e. parts which stay connected to a substrate on which they have been etched, or "free" parts such as parts belonging to the kinematic chain of a horological movement.

Compared to metals or metal alloys conventionally used for manufacturing micro-mechanical parts, such as toothed wheels, articulated parts or springs, silicon has the advantage of having a density that is 3 to 4 times lower and therefore of having a very reduced inertia and of being insensitive to magnetic fields. These advantages are particularly interesting in the horological field both for isochronism and the operating duration of the timepiece when the energy source is formed of a spring.

Silicon is however known to be sensitive to shocks, which may be necessary during assembly, inevitable in operation or accidental when for example the user knocks his wristwatch against something or drops it.

EP patent No 1 422 436 discloses a silicon hairspring formed of a spiral shaped bar coated over its entire surface with a layer of amorphous silicon oxide. According to this document, the first thermal coefficient of Young's modulus for silicon oxide is opposite to that of silicon. Thus, the combination of a core made of silicon with an external coating of oxide is said to allow a reduction in said first thermal coefficient.

This prior art document does not mention the problem of shock sensitivity of parts made of silicon.

SUMMARY OF THE INVENTION

It is an object of the present invention to provide a solution that aims to improve the mechanical resistance of a silicon micro-mechanical part and in particular its resistance to shocks.

The above object is solved according to the present invention by the characteristics of a silicon micro-mechanical part intended to be integrated in a horological mechanism, characterized in that the silicon micro-mechanical part is coated over its entire surface or a part thereof with a thick amorphous material. Additionally, particular beneficial, embodiments of the present invention are provided in accordance with the following subsidiary silicon micro-mechanical parts.

In accordance with a second silicon micromechanical part embodiment of the present invention, the first embodiment is modified so that said amorphous material is selected from the group comprising silicon oxide, nitride or carbide and titanium carbide or nitride. In accordance with a third silicon micromechanical part embodiment of the present invention, the first embodiment is also modified so that the amorphous deposition has a thickness greater than 50 nm. In accordance with a fourth silicon micromechanical part embodiment of the present invention, the second embodiment is further modified with said amorphous material is silicon dioxide and in that the thickness of said silicon dioxide is at least five times greater than the thickness of native silicon dioxide. In accordance with a fifth silicon micromechanical part embodiment of the present invention, the first embodiment is also modified so that said thick amorphous deposition is at least partially coated, over its portions in contact with other parts of the kinematic chain, with a coating selected for its tribological properties, such as diamond like carbon (DLC) or carbon nanotubes. In accordance with sixth silicon micromechanical part embodiment of the present invention, the first embodiment is modified so that the silicon micromechanical part is a toothed wheel, an escapement wheel, a lever or a hairspring The above object is also solved according to the present invention by a method for manufacturing a reinforced silicon part, characterized in that the method includes the steps consisting in: —etching said part or a batch of said parts in a silicon plate, —depositing over the entire surface of said part, in one or several steps, a thick amorphous material. Additionally, particular beneficial, embodiments of the present invention are provided in accordance with the following subsidiary methods for manufacturing a reinforced silicon part.

In accordance with a second embodiment of the method for manufacturing a reinforced silicon part, the first embodiment is modified so that thick amorphous material is silicon dioxide and in that said deposition is made by thermal oxidation, at a temperature ranging from 900° C. to 1200° C., of the entire surface of said part(s) for a period of sufficient time to obtain a silicon dioxide layer having a thickness which is at least five times greater than the thickness of native silicon dioxide. In accordance with a third embodiment of the method for manufacturing a reinforced silicon part, the first embodiment is modified so that in the first step of the method, the part is etched with slightly smaller dimensions than the desired final dimensions. In accordance with a fourth embodiment of the method for manufacturing a reinforced silicon part, the first embodiment is modified so that the method further comprises an additional step consisting in coating at least partially the amorphous material with a coating of a material selected for its tribological properties, such as diamond like carbon or carbon nanotubes.

This method enables the formation, in particular by thermal oxidation, the thick amorphous layer which considerably increases the mechanical properties of said part as will be explained in the following detailed description.

BRIEF DESCRIPTION OF THE DRAWINGS

Other features and advantages of the present invention will appear more clearly from the following description of an example embodiment, this example being given purely by way of non-limiting illustration with reference to the annexed drawings, in which.

DETAILED DESCRIPTION OF THE INVENTION

A hairspring mounted in a horological movement the malfunction of which is very easy to detect, simply by observing the movement stop if the hairspring happens to break, as will be explained hereinafter, has been taken here by way of example.

The hairspring is obtained by known etching techniques from a silicon plate of slightly smaller thickness than the desired final height for the hairspring.

One could for example use the reactive ionic etching technique (RIE) and give the hairspring the shape which is considered most appropriate, as disclosed for example in International Patent Application WO2004/070476.

Given the very small dimensions of a hairspring, a batch of hairsprings can be manufactured in one time on the same plate.

Figure 1:
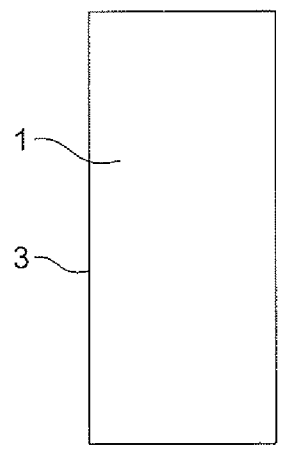
FIG. 1 shows the initial cross-section of a silicon hairspring.

FIG. 1 shows the cross-section of a hairspring having a core made of silicon, reference 3 designating the initial external surface. When this hairspring is left for a certain amount of time in the surrounding air, it naturally covers itself with silicon dioxide called "native oxide" (not shown) the thickness of which is substantially comprised between 1 and 10 nm.

Figure 2:
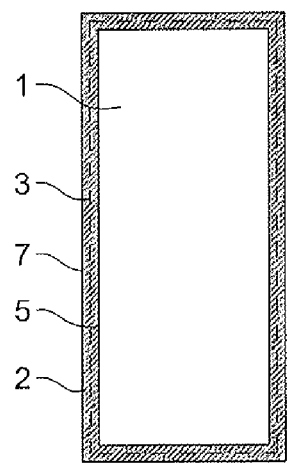
FIG. 2 corresponds to FIG. 1 after the deposition of an amorphous material.

FIG. 2 shows the same cross-section of the hairspring after it has been treated according to the invention, by a surface thermal oxidation between 900° C. and 1200° C. To this effect the protocol disclosed in the publication "Semiconductors devices: physics and technology (ed. John Wiley & Sons, ISBN 0-471-87424-8, Jan. 1, 1985, p. 341-355) is applied. Thus, it takes approximately 10 hours at a temperature of 1100° C. to obtain a thickness of silicon dioxide of about 1.9 micron. As can be seen in FIG. 2 the silicon dioxide is formed using silicon, the surface 3 of which moves backwards in order to create a new interface 5 with the formed $SiO_2$. Conversely, given that $SiO_2$ has a lower density, the external surface 7 of $SiO_2$ extends beyond the initial surface of the hairspring. The positions of these separation lines 3, 5, and 7 are not shown to scale, but it is obvious that knowledge of the physical properties of Si and $SiO_2$ and the thermal treatment characteristics allows the initial dimensions to be calculated for etching the hairspring in order to have the desired dimensions at the end of this treatment.

During a first series of tests, the mechanical resistance of non oxidized silicon parts and oxidized silicon parts was tested from the manufacturing stage to the assembly stage.

During the manufacture of a batch of silicon parts, the parts need to be manipulated at different manufacturing stages. For the specific case described in this report, silicon parts originating from two silicon plates which have undergone identical steps are considered.

The parts have subsequently been mounted in a movement. During the tests, the parts are attached to a steel arbour and are pinched with tweezers and measurement setting. During final assembly on the movement, the center of the part is driven on to a solid arbour.

The following table summarizes the results of this test carried out on 19 non oxidized parts and 36 oxidized parts.

| Plates | Non oxidized parts | | | Oxidized parts | | |
| --- | --- | --- | --- | --- | --- | --- |
| | Initial | Remainder | Success | Initial | Remainder | Success |
| 1 | 10 | 4 | 40% | 16 | 16 | 100% |
| 2 | 9 | 6 | 67% | 20 | 20 | 100% |
| Total | 19 | 10 | 53% | 36 | 36 | 100% |

During this test, comparison of the success rate of a complete chain of operations shows clearly that oxidized silicon parts are less fragile than the same parts without oxidisation.

The mechanical properties of an ordinary silicon hairspring (FIG. 1) and a hairspring modified according to the invention (FIG. 2) have also been compared in a real situation after assembly in the shock test using a shock pendulum of 5000 g.

Two identical movements, in which a non treated hairspring and a hairspring modified according to the invention have been mounted, have been subjected to this mechanical resistance test.

The movements fitted with the non oxidized hairspring or having a very thin deposition of native oxide stopped rapidly because of breakage of the hairsprings due to the shocks.

The movements fitted with the hairspring according to the invention resisted the shocks for a long time and kept the working and isochronism thereof remained satisfactory for more than 30 weeks while being worn.

Thus, surprisingly, replacing one material, silicon, with a material of lower density, silicon dioxide, increases mechanical resistance, while one might logically have expected a decrease in mechanical resistance.

In the example which has just been described, the "thick amorphous layer" was silicon dioxide. In an equivalent manner this layer could be formed with other deposition methods, using other materials such as silicon nitride or carbide or titanium carbide or nitride.

This example shows that all external surfaces of the parts are uniformly coated with a thick amorphous deposition. Of course the use of appropriate masks allows deposition on only selected portions of the part, i.e. on portions which are particularly mechanically stressed. Conversely, for example after a complete coating of $SiO_2$, it is possible to eliminate certain portions of the coating by chemical etch with BHF, for example for esthetical reasons or for forming another type of coating.

Figure 3:
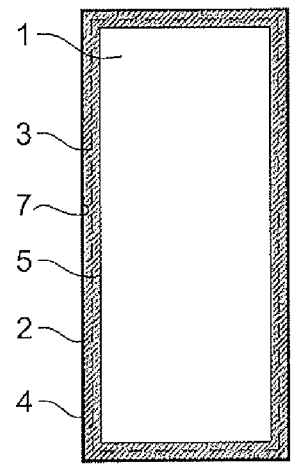
FIG. 3 shows an additional step of deposition of an anti friction coating.
Figure 4:
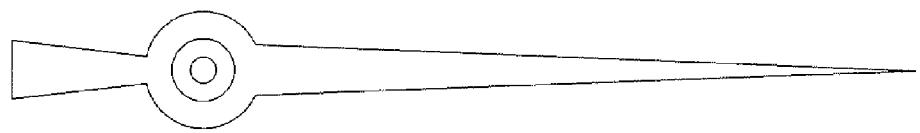
FIG. 4 shows as a silicon micromechanical part of the present invention an exemplary embodiment of pivoted parts in the form of hand for a counter of a chronograph watch.
Figure 5:
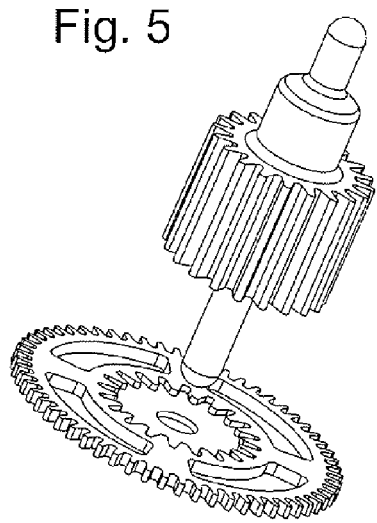
FIG. 5 shows as a silicon micromechanical part of the present invention two exemplary embodiments of toothed wheels in the form of wheel set including a toothed wheel and a toothed pinion.
Figure 6:
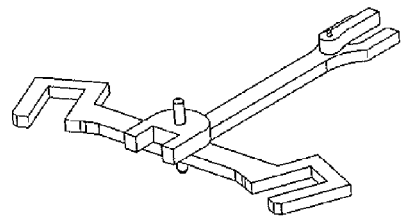
FIG. 6 shows as a silicon micromechanical part of the present invention an exemplary embodiment of a watch component generally called either pallets or an escapement lever.
Figure 7:
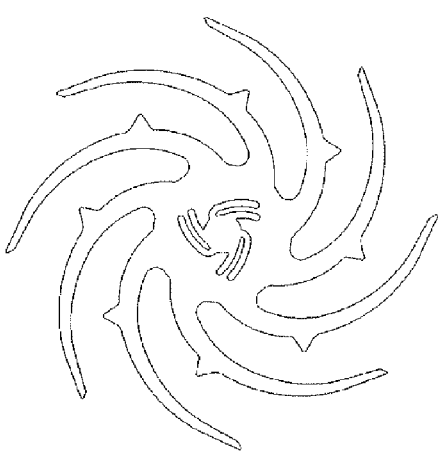
FIG. 7 shows as a silicon micromechanical part of the present invention an exemplary embodiment of escapement wheels.
Figure 8:
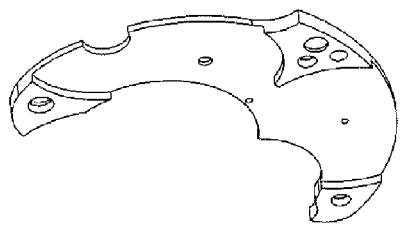
FIG. 8 shows as a silicon micromechanical part of the present invention an exemplary embodiment of passive parts in the form of integral component, formed of a bridge and bearings.

FIG. 3 shows a variant wherein an additional step adds a coating 4 made of a material selected for its tribological properties on the thick amorphous layer.

The foregoing description was made using a hairspring for a horological movement by way of example, but it is obvious that the same advantages would be found for any other parts of a watch movement, i.e., pivoted parts, toothed wheels, pallets, escapement wheels, and passive parts, illustrated in FIGS. 4-8, and for more generally any parts of a micromechanism without departing from the scope of the present invention.

The invention claimed is:

1. A reinforced silicon micromechanical part intended to be integrated in a horological mechanism, comprising:
   (1) a core made of silicon; and
   (2) a silicon dioxide layer that coats the entire surface of the core, wherein the silicon dioxide layer has a thickness greater than 50 nm,
   wherein the reinforced silicon micromechanical part is selected from the group consisting of toothed wheels, escapement wheels, pallets, pivoted parts, and passive parts.

2. The reinforced silicon micromechanical part according to claim 1, wherein the silicon dioxide layer is at least partially coated with a material selected from the group consisting of diamond like carbon and carbon nanotubes, over the portions of the silicon dioxide layer in contact with parts of a kinematic chain.

3. A method for manufacturing a reinforced silicon micromechanical part, the method including the following successive steps of:
   (a) providing a core made of silicon;
   (b) forming a micromechanical part by etching the core, wherein the micromechanical part is selected from the group consisting of toothed wheels, escapement wheels, pallets, pivoted parts, and passive parts; and
   (c) depositing a silicon dioxide layer over the entire surface of the micromechanical part, in one or several steps, wherein the deposition is made by thermal oxidation of the surface of the micromechanical part, at a temperature ranging from 900° C. to 1200° C., for a sufficient period of time, to obtain the silicon dioxide layer having a thickness greater than 50 nm whereby the reinforced silicon micromechanical part is obtained.

4. The method according to claim 3, wherein, in step (b), the micromechanical part is formed with slightly smaller dimensions than desired final dimensions.

5. The method according to claim 3, further comprising an additional step of coating at least partially the silicon dioxide layer with a material selected from the group consisting of diamond like carbon and carbon nanotubes.

6. The method according to claim 3, further comprising an additional step of eliminating certain portions of the silicon dioxide layer by chemical etching with BHF.

7. A reinforced silicon micromechanical part intended to be integrated in a horological mechanism, manufactured by a method including the following successive steps of:
   (a) providing a core made of silicon;
   (b) forming a micromechanical part by etching the core, wherein the micromechanical part is selected from the group consisting of toothed wheels, escapement wheels, pallets, pivoted parts, and passive parts; and
   (c) depositing a silicon dioxide layer over the entire surface of the micromechanical part, in one or several steps, wherein the deposition is made by thermal oxidation of the surface of the micromechanical part, at a temperature ranging from 900° C. to 1200° C., for a sufficient period of time, to obtain the silicon dioxide layer having a thickness greater than 50 nm whereby the reinforced silicon micromechanical part is obtained.

8. The reinforced silicon micromechanical part according to claim 7, wherein the micromechanical part formed in step (b) has dimensions slightly smaller than desired final dimensions.

9. The reinforced silicon micromechanical part according to claim 7, wherein the method for manufacturing the reinforced silicon micromechanical part further comprises an additional step of coating at least partially the silicon dioxide layer with a material selected from the group consisting of diamond like carbon and carbon nanotubes.

10. The reinforced silicon micromechanical part according to claim 7, wherein the method for manufacturing the reinforced silicon micromechanical part further comprises an additional step of eliminating certain portions of the silicon dioxide layer by chemical etching with BHF.

* * * * *